United States Patent
Mihnea

(10) Patent No.: US 7,088,619 B2
(45) Date of Patent: *Aug. 8, 2006

(54) METHOD FOR PROGRAMMING AND ERASING AN NROM CELL

(75) Inventor: Andrei Mihnea, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 9 days.

This patent is subject to a terminal disclaimer.

(21) Appl. No.: 11/047,809

(22) Filed: Feb. 1, 2005

(65) Prior Publication Data

US 2005/0141278 A1   Jun. 30, 2005

Related U.S. Application Data

(63) Continuation of application No. 10/636,173, filed on Aug. 7, 2003, now Pat. No. 6,873,550.

(51) Int. Cl.
*G11C 16/04*  (2006.01)

(52) U.S. Cl. ............... 365/185.18; 365/185.19; 365/185.29

(58) Field of Classification Search ........... 365/185.03, 365/185.18, 185.19, 185.29, 185.33
See application file for complete search history.

(56) References Cited

U.S. PATENT DOCUMENTS

| | | |
|---|---|---|
| 4,184,207 A | 1/1980 | McElroy |
| 4,420,504 A | 12/1983 | Cooper |
| 4,755,864 A | 7/1988 | Ariizumi |
| 4,881,114 A | 11/1989 | Mohsen |
| 5,241,496 A | 8/1993 | Lowrey |
| 5,258,949 A | 11/1993 | Chang |
| 5,330,930 A | 7/1994 | Chi |
| 5,378,647 A | 1/1995 | Hong |
| 5,379,253 A | 1/1995 | Bergemont |
| 5,397,725 A | 3/1995 | Wolstenholme |
| 5,467,305 A | 11/1995 | Bertin |
| 5,576,236 A | 11/1996 | Chang . |
| 5,687,116 A | 11/1997 | Kowshik |
| 5,768,192 A | 6/1998 | Eitan |
| 5,792,697 A | 8/1998 | Wen |
| 5,858,841 A | 1/1999 | Hsu |
| 5,877,984 A | 3/1999 | Engh |
| 5,911,106 A | 6/1999 | Tasaka |

(Continued)

FOREIGN PATENT DOCUMENTS

EP    84303740.9    1/1985

(Continued)

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.

(Continued)

*Primary Examiner*—Trong Phan
(74) *Attorney, Agent, or Firm*—Leffert Jay & Polglaze, P.A.

(57) ABSTRACT

A nitride read only memory (NROM) cell can be programmed by applying a ramp voltage to the gate input, a constant voltage to one of the two source/drain regions, and a ground potential to the remaining source/drain region. In order to erase the NROM cell, a constant voltage is coupled to the gate input. A constant positive current is input to one of the source/drain regions. The remaining source/drain region is either allowed to float, is coupled to a ground potential, or is coupled to the first source/drain region.

20 Claims, 4 Drawing Sheets

U.S. PATENT DOCUMENTS

| | | |
|---|---|---|
| 5,946,558 A | 8/1999 | Hsu |
| 5,966,603 A | 10/1999 | Eitan |
| 5,994,745 A | 11/1999 | Hong |
| 6,011,725 A | 1/2000 | Eitan |
| 6,028,342 A | 2/2000 | Chang |
| 6,030,871 A | 2/2000 | Eitan |
| 6,044,022 A | 3/2000 | Nachumovsky |
| 6,081,456 A | 6/2000 | Dadashev |
| 6,108,240 A | 8/2000 | Lavi |
| 6,133,102 A | 10/2000 | Wu |
| 6,134,156 A | 10/2000 | Eitan |
| 6,147,904 A | 11/2000 | Liron |
| 6,157,570 A | 12/2000 | Nachumovsky |
| 6,172,396 B1 | 1/2001 | Chang |
| 6,174,758 B1 | 1/2001 | Nachumovsky |
| 6,175,523 B1 | 1/2001 | Yang |
| 6,181,597 B1 | 1/2001 | Nachumovsky |
| 6,184,089 B1 | 2/2001 | Chang |
| 6,201,282 B1 | 3/2001 | Eitan |
| 6,201,737 B1 | 3/2001 | Hollmer |
| 6,204,529 B1 | 3/2001 | Lung |
| 6,207,504 B1 | 3/2001 | Hsieh |
| 6,208,557 B1 | 3/2001 | Bergemont |
| 6,215,148 B1 | 4/2001 | Eitan |
| 6,215,702 B1 | 4/2001 | Derhacobian |
| 6,218,695 B1 | 4/2001 | Nachumovsky |
| 6,222,768 B1 | 4/2001 | Hollmer |
| 6,240,020 B1 | 5/2001 | Yang |
| 6,243,300 B1 | 6/2001 | Sunkavalli |
| 6,251,731 B1 | 6/2001 | Wu |
| 6,255,166 B1 | 7/2001 | Ogura |
| 6,256,231 B1 | 7/2001 | Lavi |
| 6,266,281 B1 | 7/2001 | Derhacobian |
| 6,269,023 B1 | 7/2001 | Derhacobian |
| 6,272,043 B1 | 8/2001 | Hollmer |
| 6,275,414 B1 | 8/2001 | Randolph |
| 6,282,118 B1 | 8/2001 | Lung |
| 6,291,854 B1 | 9/2001 | Peng |
| 6,292,394 B1 | 9/2001 | Cohen |
| 6,297,096 B1 | 10/2001 | Boaz |
| 6,303,436 B1 | 10/2001 | Sung |
| 6,327,174 B1 | 12/2001 | Jung |
| 6,348,711 B1 | 2/2002 | Eitan |
| 6,392,930 B1 | 5/2002 | Jung |
| 6,396,741 B1 | 5/2002 | Bloom |
| 6,417,053 B1 | 7/2002 | Kuo |
| 6,421,275 B1 | 7/2002 | Chen |
| 6,429,063 B1 | 8/2002 | Eitan |
| 6,432,778 B1 | 8/2002 | Lai |
| 6,461,949 B1 | 10/2002 | Chang |
| 6,468,864 B1 | 10/2002 | Sung |
| 6,469,342 B1 | 10/2002 | Kuo |
| 6,477,084 B1 | 11/2002 | Eitan |
| 6,486,028 B1 | 11/2002 | Chang |
| 6,487,050 B1 | 11/2002 | Liu |
| 6,487,114 B1 | 11/2002 | Jong |
| 6,490,204 B1 | 12/2002 | Bloom |
| 6,498,377 B1 | 12/2002 | Lin |
| 6,514,831 B1 | 2/2003 | Liu |
| 6,531,887 B1 | 3/2003 | Sun |
| 6,545,309 B1 | 4/2003 | Kuo |
| 6,552,387 B1 | 4/2003 | Eitan |
| 6,559,013 B1 | 5/2003 | Pan |
| 6,576,511 B1 | 6/2003 | Pan |
| 6,580,135 B1 | 6/2003 | Chen |
| 6,580,630 B1 | 6/2003 | Liu |
| 6,602,805 B1 | 8/2003 | Chang |
| 6,607,957 B1 | 8/2003 | Fan |
| 6,610,586 B1 | 8/2003 | Liu |
| 6,613,632 B1 | 9/2003 | Liu |
| 6,617,204 B1 | 9/2003 | Sung |
| 6,643,170 B1 | 11/2003 | Huang |
| 6,671,209 B1 | 12/2003 | Lin |
| 2001/0001075 A1 | 5/2001 | Ngo |
| 2001/0004332 A1 | 6/2001 | Eitan |
| 2001/0011755 A1 | 8/2001 | Tasaka |
| 2002/0000606 A1 | 1/2002 | Eitan |
| 2002/0142569 A1 | 10/2002 | Chang |
| 2002/0146885 A1 | 10/2002 | Chen |
| 2002/0151138 A1 | 10/2002 | Liu |
| 2002/0177275 A1 | 11/2002 | Liu |
| 2002/0182829 A1 | 12/2002 | Chen |
| 2003/0057997 A1 | 3/2003 | Sun |
| 2003/0067807 A1 | 4/2003 | Lin |
| 2003/0072192 A1 | 4/2003 | Bloom |
| 2003/0117861 A1 | 6/2003 | Maayan |

FOREIGN PATENT DOCUMENTS

| | | |
|---|---|---|
| EP | 90115805.5 | 2/1991 |
| EP | 01113179.4 | 12/2002 |

OTHER PUBLICATIONS

B. Eitan et al., "Spatial Characterization of Hot Carriers Injected into the Gate Dielectric Stack of a MOFSET Based on Non-Volatile Memory Device," date unknown, pp. 58-60.

B. Eitan et al., "NROM: A Novel Localized Trapping, 2-Bit Nonvolatile Memory Cell," IEEE Electron Device Lett, vol. 21, No. 11, (Nov. 2000), pp. 543-545, Copyright 2000 IEEE.

E. Maayan et al., "A 512Mb NROM Flash Data Storage Memory with 8MB/s Data Range," Dig. IEEE Int. Solid-State Circuits Conf., San Francisco, (Feb. 2002), pp. 1-8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp. 76-77, 407-408. Copyright 1990 IEEE.

M. Janai, "Data Retention, Endurance and Acceleration Factors of NROM Devices," IEEE 41st Annual International Reliability Physics Symposium, Dallas, TX (2003), pp. 502-505, Copyright 1989 IEEE.

S. Minami and Y. Kamigaki. "A Novel MONOS Nonvolatile Memory Device Ensuring 10-Year Data Retention after $10^7$ Erase/Write Cycles," IEEE Transactions on Electron Devices, vol. 40, No. 11 (Nov. 1993) pp. 2011-2017, Copyright 1998 IEEE.

C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990), pp. 1439-1443, Copyright 1990 IEEE.

P. Manos and C. Hart, "A Self-Aligned EPROM Structure with Superior Data Retention," IEEE Electron Devices Letters, vol. 11, No. 7, (Jul. 1990) pp. 309-311, Copyright 1990 IEEE.

W. Owen and W. Tchon, "$E^2$PROM Product Issues and Technology Trends," IEEE 1989, pp. 17-19, Copyright 1989 IEEE.

T. Huang, F. Jong, T. Chao, H. Lin, L. Leu, K. Young, C. Lin, K. Chiu, "Improving Radiation Hardness of EEPROM/Flash Cell By $N_2O$ Annealing," IEEE Electron Device Letters, vol. 19, No. 7 (Jul. 1998), pp. 256-258, Copyright 1998 IEEE.

B. Eitan et al., "Electrons Retention Model for Localized Charge in Oxide-Nitride-Oxide (ONO) Dielectric," IEEE Device Lett., vol. 23, No. 9, (Sep. 2002), pp. 556-558. Copyright 2002 IEEE.

T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.

F. Vollebregt, R. Cuppens, F. Druyts, G. Lemmen, F. Verberne, J. Solo, "A New E(E)PROM Technology With A $TiSi_2$ Control Gate," IEEE 1989, pp. 25.8.1-25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

S. Ogura, et al. "Twin MONOS Cell with Dual Control Gates," Halo LSI and New Halo, pp 187-187.3, Date Unknown.

T. Sugizaki, et al. "New 2-bit/Tr MONOS Type Flash Memory using $Al_2O_3$ as Charge Trapping Layer," Fujitsu Laboratories Ltd, Date Unknown.

T. Saito, et al. "Hot Hole Erase Characteristics and Reliabilty in Twin MONOS Device" Halo LSI, Date Unknown.

Saifun Semiconductors, LTD. PowerPoint Presentation, Date Unknown.

Y. Roizin, et al. "Novel Techniques for data retention and Leff measurements in two bit *Micro*Flash® Memory Cells," Characterization and Metrology for ULSI Technology: 200 International Conf., pp. 181-185, Copyright 2001 American Institute of Physics, 1-56396-967-X/01.

W. J. Tsai, et al. "Cause of Data Retention Loss in a Nitride-Based Localized Trapping Storage Flash Memory Cell," IEEE 40th Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al., "Subtreshold slope degradation model for localized-charge-trapping based non-volatile memory devices," Solid-State Electronics 47 (2003), pp. 937-974. Copyright 2003 Elsevier Science Ltd.

R. Neale, "AMD's MirrorBit—a big step in Flash progress," Electronic Engineering Design, V. 74, No. 906, pp. 47-50.

I. Bloom, et al., "NROM™—a new technology for non-volatile memory products" Solid-State Electronics 46 (2002), pp. 1757-1763. Copyright 2002 Elsevier Science Ltd.

J. Bu and M. White, " Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001 pp. 534-535.

A. Nughin, "n-Channel 256kb and 1MB EEPROMs," SSCC91, Session 134, Special Session on Technology in the USSR, Paper 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., Date Unknown.

L. Breuil, "A new 2 isolated-bits/cell flash memory device with self aligned split gate structure using ONO stacks for charge storage," IMEC, Date Unknown.

J. Willer, et al., "UMEM: A U-shape Non-Volatile-Memory Cell," Ingentix GmbH &Co. KG., Infineon Technologies and Saifun Semiconductors, Date Unknown.

S. Kang, et al., "A Study of SONOS Nonvolatile Memory Cell Controlled Structurally by Localizing Charge-Trapping Layer," Samsung Electrons Co., Ltd., Date Unknown.

Y. Roizin, et al., "In-Process Charging in *micro*FLASH® Memory Cells," Tower Semiconductor, Ltd., Date Unknown.

A. Shappir, et al., "Subthreshold slope degradation model for localized-charge-trapping based non-volatile memory devices," Solid State Electronics, 47 (2003) pp. 937-941, Copyright 2003 Elsevier Science Ltd.

I. Fujiwara, et al., "High speed program/erase sub 100 nm MONOS memory cell," Sony Corporation, Date Unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., Date Unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao-Tung University, Date Unknown.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., Date Unknown.

J. H. Kim, et al., "Highly Manufacturable SONOS Non-Volatile Memory for the Embedded SoC Solution," 2003 Symposium on VLSI Technology Digest of Technical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D. M. Kim, "High-Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K. K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infineon Technologies, Date Unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, Date Unknown.

Y. Roizin, et al., "Retention Characteristics of microFLASH® Memory (Activation Energy of Traps in the ONO Stack)," Tower Semiconductor, Ltd., Date Unknown.

Y. Roizin, et al., "Activation Energy of Traps in the ONO Stack of microFLASH® Memory Cells," Tower Semiconductor, Ltd., Date Unknown.

Y. Roizin, et al., "'Dummy' Gox for Optimization of microFLASH® Technology," Tower Semiconductor, Ltd., Date Unknown.

Y. K. Lee, et al., "Multi-Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI., Date Unknown.

J. Bu, et al., "Retention Reliability Enhanced SONOS NVSM with Scaled Programming Voltage," Microelectronics Lab., Date Unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147-148.

METHOD FOR PROGRAMMING AND ERASING AN NROM CELL

RELATED APPLICATIONS

This application is a Continuation of U.S. application Ser. No. 10/636,173 filed Aug. 7, 2003, now U.S. Pat. No. 6,873,550

TECHNICAL FIELD OF THE INVENTION

The present invention relates generally to memory devices and in particular the present invention relates to programming and erasing nitride read only memory cells.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

There are several different types of memory such as random access memory (RAM) and read only memory (ROM). RAM is typically used as main memory in a computer environment. One can repeatedly read data from and write data into RAM. Most RAM is volatile, which means that it requires a steady flow of electricity to maintain its contents. When the power is turned off, the data in RAM is lost.

This is in contrast to ROM that generally only permits the user to read data already stored in the ROM but the ROM retains data after power is removed (i.e., non-volatile). Computers almost always contain a small amount of ROM that holds instructions for starting up the computer. Unlike RAM, ROM generally cannot be written to in routine operation.

Yet another type of non-volatile memory is flash memory. A flash memory is a type of EEPROM that can be erased and reprogrammed in blocks instead of one byte at a time. Many modern PCs have their BIOS stored on a flash memory chip so that it can easily be updated if necessary. Flash memory is also popular in modems because it enables the modem manufacturer to support new protocols as they become standardized.

Another type of non-volatile memory is a nitride read only memory (NROM). NROM has some of the characteristics of flash memory but does not require the special fabrication processes of flash memory. NROM can be implemented using a standard CMOS process.

Because of NROM's CMOS process, the NROM can be embedded into other architectures, such as microcontrollers, that also use the CMOS process. However, one problem with embedding the NROM is that an NROM memory array, susceptible for embedding, requires high current consumption for program and erase.

For the reasons stated above, and for other reasons stated below which will become apparent to those skilled in the art upon reading and understanding the present specification, there is a need in the art for a way to erase NROM arrays without being over-erased.

SUMMARY

The above-mentioned problems with programming and erasing NROM arrays and other problems are addressed by the present invention and will be understood by reading and studying the following specification.

The various embodiments relate to programming and erasing NROM cells. In one embodiment, these cells are embedded in CMOS integrated circuits. One embodiment for programming an NROM cell includes applying a ramp voltage to a gate input. A constant voltage is applied to one of the two source/drain regions. The remaining source/drain region is coupled to ground potential.

One embodiment for erasing an NROM cell includes applying a constant voltage to the gate input. A constant positive current is sourced to one of the source/drain regions. The remaining source/drain region is allowed to either float, coupled to ground, or is coupled to the first source/drain region, depending on the embodiment.

In another embodiment, the erase operation includes applying a constant voltage to one of the source/drain regions. A negatively ramped voltage is coupled to the gate input and the remaining source/drain region is coupled to ground, allowed to float, or coupled to the first source/drain region, depending on the embodiment.

Further embodiments of the invention include methods and apparatus of varying scope.

DETAILED DESCRIPTION

Figure 1A:
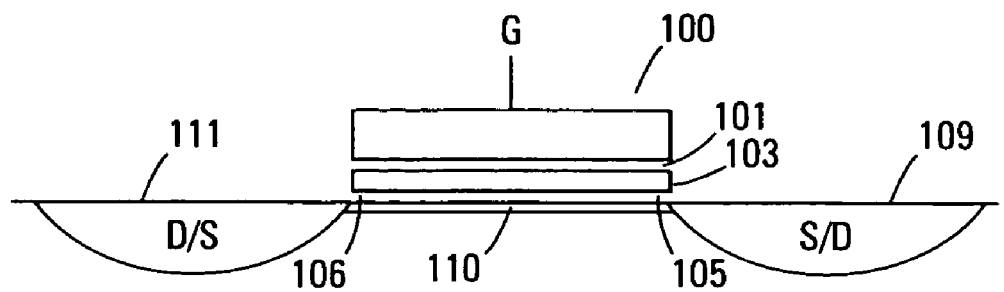
FIGS. 1A and B show diagrams of an NROM memory cell of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1B:
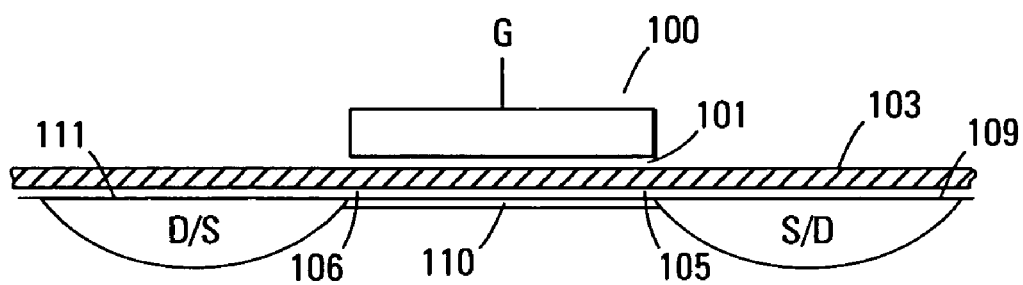

FIGS. 1A and 1B illustrate a diagram of an NROM memory cell of the present invention. This cell is comprised of a control gate 100 formed on top of an oxide layer 101. Below the oxide layer is a layer of nitride 103 upon which the charge is stored for the various states of the cell. In one embodiment, the cell has areas 105 and 106 for storing two bits of data on the nitride 103. The nitride 103 can be patterned either in isolated patches matching the individual cells (as in FIG. 1A) or as a continuous blanket covering a whole unit of memory array (as in FIG. 1B).

Two source/drain regions 109 and 111 are at either end of the gate 100. The source/drain regions 109 and 111 are connected by a channel area 110 between the two regions 109 and 111. The function of each source/drain region 109 or 111 (i.e., whether source or drain) depends upon which bit area 105 or 106 is being read or written. For example, in a read operation, if the carrier is input at the left side source/drain region 111 and output from the right side region 109, the left side is the source 111 and the right side is the drain 109 and the data bit charge is stored on the nitride 103 at the source end 111 for bit area 106.

Figure 2:
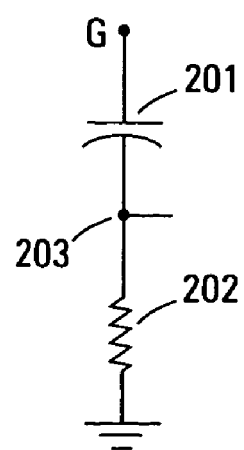
FIG. 2 shows a circuit equivalent for the program operation in the NROM memory cell in accordance with FIG. 1.

FIG. 2 illustrates a circuit that models the NROM memory cell of FIG. 1. This circuit is comprised of a capacitor 201 coupled through a node 203 to a resistor 202. This model will be referred to subsequently with reference to the programming method of FIG. 3.

Standard long-channel NROM cells for double-bit storage are inherently insensitive to over-erasure. The threshold voltage for such a cell in an erased state is kept at its "neutral" value by the mid-channel region away from either source/drain region, which has no holes trapped in the nitride dielectric above.

A newer type of short-channel NROM cells forgoes the double-bit storage in exchange for programming at a lower voltage. Such cell structure and operation are particularly well suited for embedded memory applications. These short-channel NROM cells can inject hot holes in the mid-channel region during an erase operation and thus become sensitive to over-erasure like traditional stack-gate flash memory. The methods of the present invention are applicable to both long channel (double-bit) and short channel (single-bit) architectures.

One problem with embedding an NROM memory array in another CMOS device is that the NROM memory array typically requires 10V and a high programming current. This could potentially damage the other circuitry in the device in which the NROM is embedded.

Figure 3:
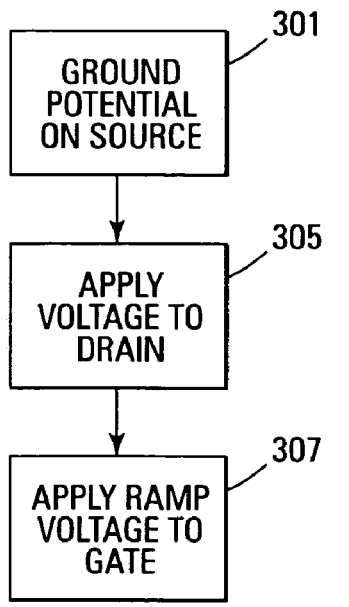
FIG. 3 shows a flow chart of a method for programming an NROM memory cell in accordance with one embodiment of the present invention.
Figure 4:
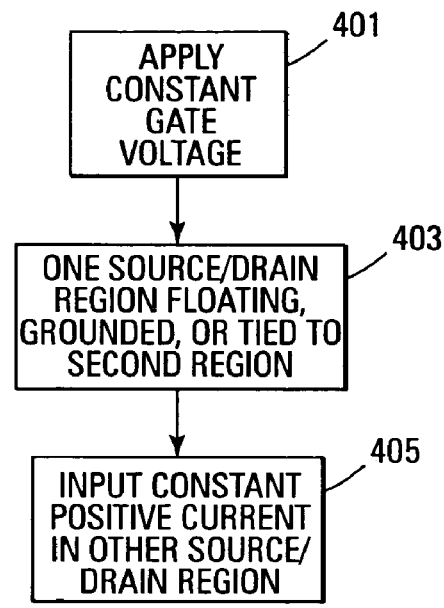
FIG. 4 shows a flow chart of a method for erasing an NROM memory cell in accordance with one embodiment of the present invention.
Figure 5:
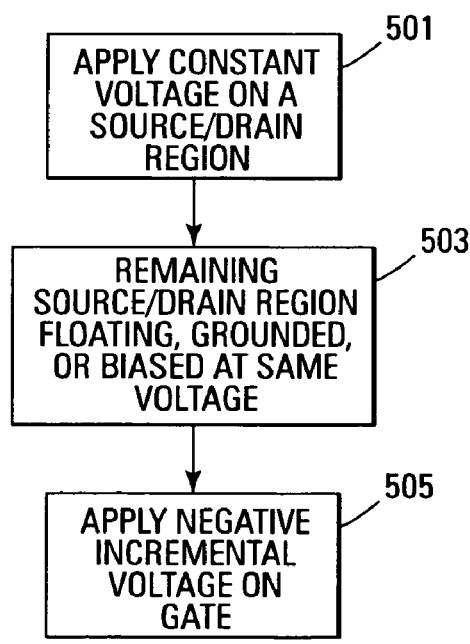
FIG. 5 shows a flow chart of a method for erasing an NROM memory cell in accordance with an alternate embodiment of the present invention.

FIGS. 3–5, as discussed subsequently, illustrate the various methods for programming and erasing of the present invention. The order of the steps is for illustration purposes only. It is preferred that all voltages be applied and developed simultaneously. However, alternate embodiments may use one or more sequential steps in applying the voltages FIG. 3 illustrates a flow chart of a method for programming an NROM memory array in accordance with one embodiment of the present invention. This method does not require either a high constant voltage or a high programming current.

The source region is at ground potential 301 when a voltage in the range of 3.0 to 6V is applied to the drain region 305. Alternate embodiments use other voltages on these connections. For example, in one embodiment, the source may have a reverse source to body voltage applied.

A linear ramp voltage is applied to the control gate of the cell 307. In one embodiment, this voltage starts in the range of 0 to 6V and goes up to 4 to 12V for a time in the range of 0.001–1 millisecond. In one embodiment, the ramp voltage starts at 5V and goes up to 10V. Alternate embodiments use other ranges for the voltages and the time.

Using the method of FIG. 3 to the circuit of FIG. 2, the ramp voltage is applied to the capacitor 201. The voltage at the node 203 ramps up to a certain point then levels off. This point is where the displacement current of the capacitor 201 equals the conduction current of the resistor 202. This constant voltage maintains the constant current for programming the memory array while the input voltage ramps up.

FIG. 4 illustrates a flow chart of a method for erasing an NROM memory array in accordance with one embodiment of the present invention. This method applies a constant gate voltage 401 in the range of 0 to −12V. In one embodiment, the gate voltage is approximately −7V.

One of the source/drain regions can remain floating, grounded, or tied to the other source/drain region 403. The other drain/source region has a constant positive current applied 405.

The injected constant current is in the range of gate induced drain leakage (GIDL) of 0.1 nA to 10 µA per cell in the NROM array. These voltages, in one embodiment, are applied for a time in the range of 1 µs to 1 second. Alternate embodiments use other ranges of time.

In an alternate embodiment, the voltage that the forced current develops on the drain/source region 405 can be monitored. The erase operation can then be ended when this voltage reaches a predetermined voltage. This voltage threshold can be set to any value in correlation with the dynamics of the erase operation for the NROM cells.

FIG. 5 illustrates a flow chart of an alternate embodiment method of the present invention for erasing an NROM memory array. This method applies a constant voltage on one of the source/drain regions 501. The other drain/source region remains floating, grounded, or biased with the same voltage as the first source/drain region 503. The gate has a negatively ramped voltage applied 505. In one embodiment, this voltage is in the range of 0 to −4V and goes down to −7 to −12.

By ramping the gate voltage, the erase method of FIG. 5 can perform an erase operation with less drain current consumption than a prior art erase operation. This can reduce the overall power requirements of the device into which the NROM array is embedded.

In the methods of FIGS. 3–5, the erase operation would proceed at a more constant pace than in a prior art erase operation with constant voltages. Additionally, the current absorbed by the array would be uniform in time and lower for the methods of the present invention than at the beginning of an erase pulse in the prior art method. The GIDL and the rate of charge trapping in the oxide-nitride-oxide dielectric remain constant throughout the time of the erase operation.

Figure 6:
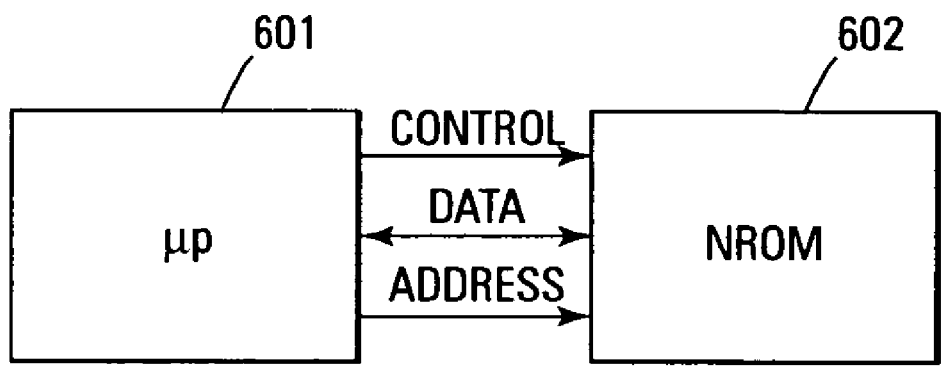
FIG. 6 shows a block diagram of one embodiment of a system of the present invention having an embedded NROM array.

FIG. 6 illustrates a block diagram of a CMOS system in which an NROM array is embedded. This system is comprised of a microprocessor 601 coupled to the NROM array 602 over CONTROL, ADDRESS, and DATA buses. These components 601 and 602 are incorporated onto a single integrated circuit die. Alternate embodiments may add additional components such as input/output circuitry and other types of memory.

CONCLUSION

The methods of the present invention for programming and erasing an embedded NROM array operate effectively on both long-channel and short-channel cells. These methods provide a means for programming and erasing while maintaining a constant programming and erase current at lower voltages. This decreases power consumption and increases the reliability, thus decreasing the failure rate, of the device.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a nitride read only memory (NROM) cell in a CMOS device, the NROM cell having a gate input and two source/drain regions, the method comprising:
applying a ramp voltage to the gate input;
applying a constant voltage to one of the two source/drain regions; and
applying a ground potential to the remaining source/drain region.

2. The method of claim 1 wherein the source/drain region to which the constant voltage is applied is acting as a drain region and the source/drain region to which the ground potential is applied is acting as a source region.

3. The method of claim 1 wherein the ramp voltage starts in a range of 0 to 6V and ends in a range of 4 to 12V.

4. The method of claim 1 wherein the ramp voltage has a time period in a range of 1 microsecond to 1 millisecond from start to end.

5. The method of claim 1 wherein the ramp voltage starts at 5V and goes to 10V.

6. The method of claim 1 wherein the constant voltage is in a range of 3.5 to 6V.

7. A CMOS device having a nitride read only memory (NROM) cell, the NROM cell comprising:
a gate input coupled to a ramp voltage;
a first source/drain region coupled to a constant voltage; and
a second source/drain region coupled to a ground potential.

8. The CMOS device of claim 7 and further comprising an oxide-nitride-oxide region between the first and second source/drain regions that can hold a data bit on each end of the oxide-nitride-oxide region.

9. The CMOS device of claim 7 and further comprising an oxide-nitride-oxide region between the first and second source/drain regions that can hold a single data bit.

10. The CMOS device of claim 7 wherein the constant voltage is in a range of 3.5 to 6V and the ramp voltage starts in a range of 0 to 6V and ends in a range of 4 to 12V over a time period in a range of 1 microsecond to 1 millisecond.

11. A method for performing an erase operation in a CMOS memory device comprising an NROM array that has a nitride read only memory (NROM) cell, the NROM cell having a gate input and two source/drain regions, the method comprising:
applying a constant voltage to the gate input;
applying a constant positive current into a first of the source/drain regions; and
floating the remaining source/drain region.

12. A method for erasing a nitride read only memory (NROM) cell in a CMOS memory system comprising a processor coupled to an NROM array that comprises the NROM cell, the NROM cell having a gate input and two source/drain regions, the method comprising:
applying a constant voltage to the gate input;
applying a constant positive current into a first of the source/drain regions; and
applying a ground potential to the remaining source/drain region.

13. The method of claim 12 and further including:
monitoring the first source/drain region for a predetermined voltage level; and
ending the erase operation when the predetermined voltage level is reached.

14. The method of claim 12 wherein the constant gate voltage is in a range of 0 to −12V, the constant positive current is in a range of 0.1 nA to 10 µA per cell, and the erase operation has a duration in a range of 1 µs to 1 second.

15. A method for erasing a nitride read only memory (NROM) cell in a CMOS memory device comprising a processor coupled to an NROM array that comprises the NROM cell, the NROM cell having a gate input and two source/drain regions, the method comprising:
applying a constant voltage to the gate input;
applying a constant positive current into a first source/drain region; and
coupling the remaining source/drain region to the first source/drain region.

16. The method of claim 15 wherein constant gate voltage is in a range of 0 to −12V, the constant positive current is in a range of 0.1 nA to 10 µA per cell, and the erase operation has a duration in a range of 1 µs to 1 second.

17. A method for erasing a nitride read only memory (NROM) cell in a CMOS memory system comprising a microprocessor coupled to an NROM array that comprises the NROM cell, the NROM cell having a gate input and two source/drain regions, the method comprising:
applying a constant voltage to a first of the source/drain regions;
applying a negatively ramped voltage to the gate input; and
allowing the remaining source/drain region to float.

18. The method of claim 17 wherein the constant voltage is in a range of 3.5 to 6V and the negatively ramped voltage starts in a range of 0 to −4V and ends in a range of −7 to −12V over a time period in a range of 1 microsecond to 1 millisecond.

19. A method for erasing a nitride read only memory (NROM) cell in a CMOS memory device comprising a microprocessor coupled to an NROM array that comprises the NROM cell, the NROM cell having a gate input and two source/drain regions, the method comprising:
applying a constant voltage to a first of the source/drain regions;
applying a negatively ramped voltage to the gate input; and
coupling the remaining source/drain region to the first source/drain region.

20. A method for erasing a nitride read only memory (NROM) cell in a CMOS memory device comprising an NROM array that comprises the NROM cell, the NROM cell having a gate input and two source/drain regions, the method comprising:
applying a constant voltage to a first of the source/drain regions;
applying a negatively ramped voltage to the gate input; and
applying a ground potential to the remaining source/drain region.

* * * * *